(12) United States Patent  
Rahim et al.

(10) Patent No.: US 7,902,611 B1
(45) Date of Patent: Mar. 8, 2011

(54) INTEGRATED CIRCUIT WELL ISOLATION STRUCTURES

(75) Inventors: Irfan Rahim, San Jose, CA (US); Bradley Jensen, San Jose, CA (US); Peter J. McElheny, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 113 days.

(21) Appl. No.: 11/998,016

(22) Filed: Nov. 27, 2007

(51) Int. Cl.
*H01L 21/70* (2006.01)
*H01L 23/52* (2006.01)
*H01L 29/00* (2006.01)

(52) U.S. Cl. ......... 257/374; 257/376; 257/499; 257/506; 257/528; 257/529; 257/530; 365/178

(58) Field of Classification Search .................. 257/374, 257/499, 506, 510–519, 528–530, 376
See application file for complete search history.

(56) References Cited

U.S. PATENT DOCUMENTS

| | | | | |
|---|---|---|---|---|
| 5,475,335 A * | 12/1995 | Merrill et al. | ................ | 327/536 |
| 5,537,075 A * | 7/1996 | Miyazaki | ................ | 327/566 |
| 5,617,369 A * | 4/1997 | Tomishima et al. | ..... | 365/230.06 |
| 5,622,885 A * | 4/1997 | Merrill et al. | ................ | 438/220 |
| 5,940,717 A | 8/1999 | Rengarajan et al. | | |
| 6,022,787 A | 2/2000 | Ma | | |
| 6,100,751 A * | 8/2000 | De et al. | ................ | 327/534 |
| 6,130,469 A * | 10/2000 | Bracchitta et al. | ............ | 257/530 |
| 6,218,895 B1* | 4/2001 | De et al. | ................ | 327/566 |
| 6,495,424 B2 | 12/2002 | Kunikiyo | | |
| 6,897,543 B1 | 5/2005 | Huang et al. | | |
| 6,960,818 B1 | 11/2005 | Rengarajan et al. | | |
| 6,967,522 B2* | 11/2005 | Chandrakasan et al. | ....... | 327/534 |
| 7,272,067 B1 | 9/2007 | Huang et al. | | |
| 2001/0005327 A1* | 6/2001 | Duane et al. | ................ | 365/159 |
| 2002/0005750 A1* | 1/2002 | Kao et al. | ................ | 327/536 |
| 2002/0130384 A1* | 9/2002 | Aton | ................ | 257/510 |
| 2004/0016977 A1* | 1/2004 | Miyazaki et al. | ............ | 257/393 |
| 2004/0219733 A1* | 11/2004 | Algotsson et al. | ............ | 438/202 |
| 2005/0106800 A1* | 5/2005 | Haensch et al. | .............. | 438/199 |
| 2006/0091465 A1* | 5/2006 | Chen | ................ | 257/360 |

* cited by examiner

*Primary Examiner* — Mary Wilczewski
*Assistant Examiner* — Jeremy J Joy
(74) *Attorney, Agent, or Firm* — Treyz Law Group; G. Victor Treyz; Jason Tsai

(57) ABSTRACT

An integrated circuit is provided with transistor body regions that may be independently biased. Some of the bodies may be forward body biased to lower threshold voltages and increase transistor switching speed. Some of the bodies may be reverse body biased to increase threshold voltages and decrease leakage current. The integrated circuit may be formed on a silicon substrate. Body bias isolation structures may be formed in the silicon substrate to isolate the bodies from each other. Body bias isolation structures may be formed from shallow trench isolation trenches. Doped regions may be formed at the bottom of the trenches using ion implantation. Oxide may be used to fill the trenches above the doped region. A deep well may be formed under the body regions. The deep well may contact the doped regions that are formed at the bottom of the trenches.

12 Claims, 12 Drawing Sheets

INTEGRATED CIRCUIT WELL ISOLATION STRUCTURES

BACKGROUND

This invention relates to integrated circuits, and more particularly, to isolation structures on integrated circuits such as programmable logic device integrated circuits that allow different body biases to be applied to different regions of circuitry.

The performance of modern integrated circuits is often limited by power consumption considerations. Circuits with poor power efficiency place undesirable demands on system designers. Power supply capacity may need to be increased, thermal management issues may need to be addressed, and circuit designs may need to be altered to accommodate inefficient circuitry.

Integrated circuits often use complementary metal-oxide-semiconductor (CMOS) transistor technology. CMOS integrated circuits have n-channel metal-oxide-semiconductor (NMOS) and p-channel metal-oxide-semiconductor (PMOS) transistors. To address power consumption concerns, designers of integrated circuits are beginning to consider selectively controlling leakage currents in NMOS and PMOS transistors.

NMOS and PMOS transistors have four terminals—a drain, a source, a gate, and a body. The body terminal, which is sometimes referred to as the well or bulk terminal, can be biased. For example, a negative bias voltage can be applied to the p-type body of an NMOS transistor or a bias voltage that is increased somewhat relative to a positive power supply voltage may be applied to the n-type body of a PMOS transistor. These bias voltages, which are sometimes referred to as reverse body biases, increase the threshold voltages of the transistors and thereby reduce their leakage currents. Reductions in leakage current can be achieved that reduce power consumption at the expense of reduced switching speed. If desired, forward body bias arrangements can be used to decrease the threshold voltages of MOS transistors and thereby improve performance at the expense of increased leakage currents.

It may be desirable to selectively control the leakage currents and performance associated with transistors in different portions of an integrated circuit. For example, it may be desirable to apply one body bias voltage to the body terminals of transistors in one part of a circuit while applying another body bias voltage to the body terminals of transistors in another part of the integrated circuit. By proper selection of the body bias voltages, power consumption may be reduced without adversely affecting circuit performance in critical circuit blocks.

In order to ensure that transistors in different regions of circuitry can have body terminals with different bias voltages, the body terminals in the different regions of circuitry must be isolated from each other. Care must be taken, however, that the isolation structures that are formed are not excessively large. Isolation structures that are not efficient may consume large amounts of circuit real estate. This, in turn, may significantly limit the degree of granularity that may be provided when implementing a selective body bias adjustment scheme on an integrated circuit.

It would therefore be desirable to provide ways in which to isolate transistor body regions from each other on an integrated circuit.

SUMMARY

In accordance with the present invention, an integrated circuit such as a programmable logic device integrated circuit is provided. The integrated circuit may be formed from a silicon substrate. Metal-oxide-semiconductor transistors may be formed in the silicon substrate. The metal-oxide-semiconductor transistors may each have a gate terminal, a source terminal, a drain terminal, and a body terminal. The body terminals of multiple transistors may be connected together to a common transistor body region.

The body regions of different groups of transistors may be adjusted individually to optimize transistor performance. In portions of the integrated circuit that contain critical circuitry, transistor body regions can be biased at body voltages that allow the transistors to switch rapidly (e.g., forward body biases). In portions of the integrated circuit in which transistor switching speed is not critical, the bodies can be reverse body biased to reduce transistor leakage current and thereby reduce power consumption.

To ensure that the different transistor body regions can be biased independently, the integrated circuit may be provided with body bias isolation structures. The body bias isolation structures may be formed from trenches. The trenches may be formed from shallow trench isolation (STI) trench structures. A nitride mask may be used as an etch mask when forming the trenches. The nitride mask may also be used as an implant mask when implanting dopant at the bottom of the trenches. The implanted dopant forms doped regions at the bottom of the trenches.

Insulator may be used to fill the trenches after the doped regions have been formed at the bottom of the trenches. For example, shallow trench isolation oxide may be used to fill the trenches. The oxide in the trenches may be planarized using chemical mechanical polishing.

Deep wells can be formed under the body regions. For example, a deep n-well can be formed under p-type bodies using ion implantation. Deep n-wells that are formed in this way may contact the doped regions that are formed at the base of the trenches. The doped regions may be, for example, n-type doped regions.

Further features of the invention, its nature and various advantages will be more apparent from the accompanying drawings and the following detailed description.

DETAILED DESCRIPTION

Figure 1:
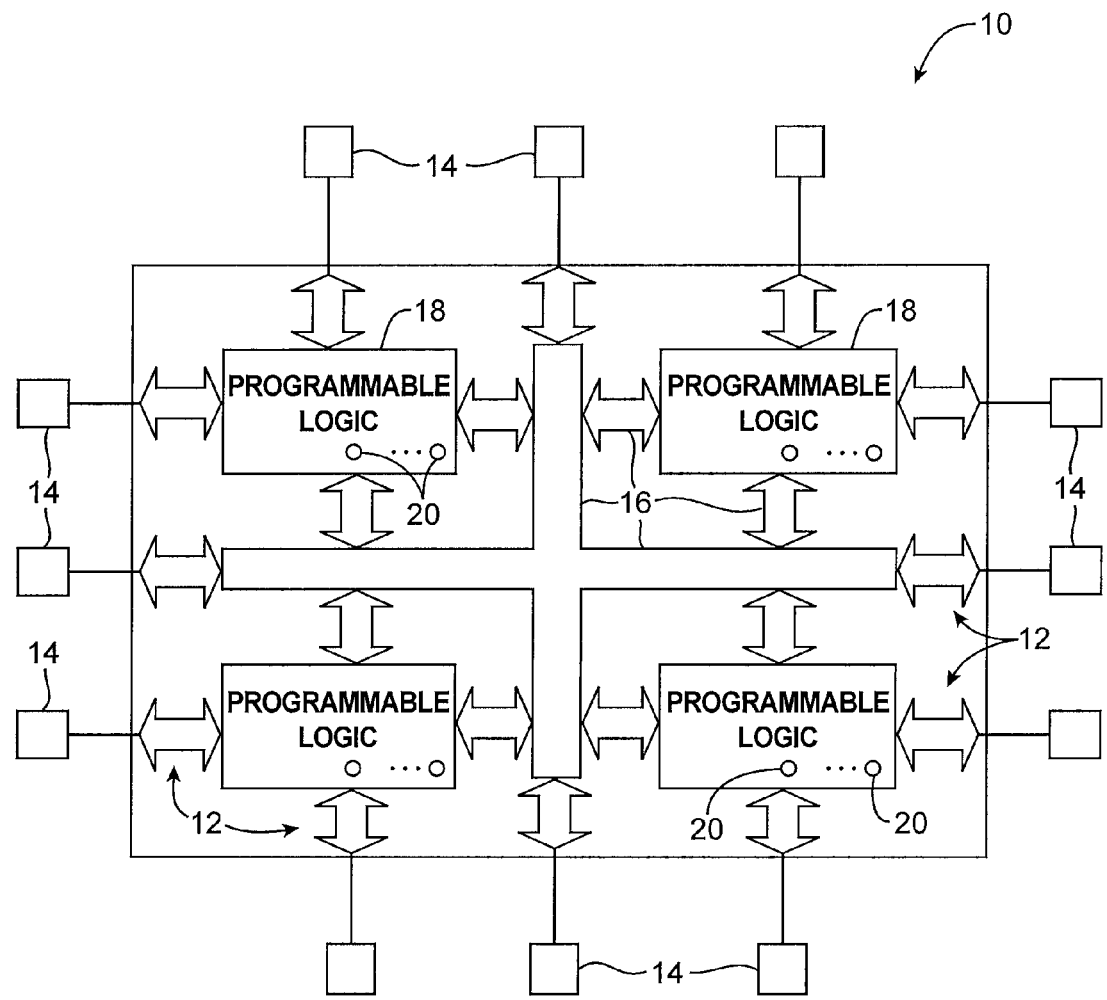
FIG. 1 is a diagram of an illustrative programmable logic device integrated circuit in accordance with an embodiment of the present invention.

The present invention relates to isolation structures for integrated circuits that have regions of metal-oxide-semiconductor transistors with different body biases. With one particularly suitable arrangement, regions of transistors and isolation structures are provided on integrated circuits such as programmable logic device integrated circuits. This is, however, merely illustrative. The transistors and isolation structures may be provided on other programmable integrated circuits, on integrated circuits such as digital signal processors, on microprocessors, on custom integrated circuits, or on any other suitable type of integrated circuit. The present invention is generally described in the context of integrated circuits such as programmable logic device integrated circuits as an example.

Programmable integrated circuits such as programmable logic devices can be customized using configuration data. In a typical scenario, a logic designer uses a computer-aided design (CAD) system in designing a desired logic circuit. The computer-aided design system uses information on the hardware capabilities of a device to generate configuration data.

Programmable logic devices contain programmable elements. The programmable elements may be based on any suitable programmable technology such as fuses, antifuses, laser-programmed elements, electrically-programmed elements, non-volatile memory elements, volatile memory elements, mask-programmed elements, etc. In a typical scenario, the programmable elements are based on random-access memory (RAM) cells.

To customize programmable logic devices to implement the desired logic circuit, the configuration data produced by the computer-aided design system is loaded into the programmable elements. During operation of the programmable logic device, each programmable element provides a static output signal based on its loaded configuration data. The outputs signals from the programmable elements are applied to the gates of metal-oxide-semiconductor transistors in regions of programmable logic on the programmable logic device. This configures the programmable logic so that the programmable logic device implements the desired logic circuit.

The programmable logic and other circuitry on the programmable logic device is formed from n-channel metal-oxide-semiconductor field-effect transistors (NMOS transistors) and p-channel metal-oxide-semiconductor field-effect transistors (PMOS transistors). Integrated circuits with NMOS and PMOS transistors are referred to as complementary metal-oxide-semiconductor (CMOS) integrated circuits.

To reduce power consumption while maintaining acceptable levels of device performance, the transistors on the circuit may be provided with selective body biases. In regions in which performance is not critical, the transistors can be provided with reverse body biases to reduce leakage current. For example, NMOS transistors may be provided a body bias voltage that is slightly lower than ground and PMOS transistors may be provided with a body bias voltage that is slightly larger than their positive power supply voltage. These body bias voltages reduce power consumption by reducing leakage current at the expense of reduced transistor switching speeds. When power-reducing body bias voltages are used in portions of a circuit that are not speed critical, power consumption can be reduced without adversely affecting overall device performance.

In portions of the circuit that include speed-critical circuitry, the body bias voltages of the transistors can be set to levels that allow for faster transistor switching speeds. For example, NMOS transistors may be provided with a ground body bias, a positive body bias, or at least a body bias that is less negative than the reverse body bias that is used in reducing the leakage current of the NMOS transistors for which performance is not critical. Similarly, PMOS transistors can be provided with a body bias voltage that is lower than the body biases used in reducing the leakage current of the PMOS transistors for which performance is not critical.

Because the body bias voltages in different regions of the integrated circuit may, in general, be different, isolation structures may be used to electrically separate the regions from each other. The isolation structures may be formed from insulators and doped semiconductor regions. To minimize the amount of circuit area that is consumed by the isolation structures, the doped regions in the isolation structures may be formed using relatively shallow implants. With one particularly suitable arrangement, the implants may be made formed through implant mask structures that are aligned with shallow trench isolation (STI) trenches.

An illustrative programmable logic device 10 in accordance with the present invention is shown in FIG. 1. Programmable logic device 10 has input-output circuitry 12 for driving signals off of device 10 and for receiving signals from other devices via input-output pins 14. Interconnection resources 16 such as global and local vertical and horizontal conductive lines and buses are used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources 16 may be considered to be a part of programmable logic 18.

The programmable elements 20 in logic 18 may be loaded from any suitable source. In a typical arrangement, the programmable elements are loaded from an external erasable-programmable read-only memory and control chip called a configuration device via pins 14 and input-output circuitry 12.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

The primary processing circuitry of integrated circuits such as integrated circuit 10 of FIG. 1 is located in the central region of the device. Input-output circuitry 12 is typically located around the periphery of the integrated circuit. The central region of the device is sometimes referred to as the core of the device and the circuitry in that region is sometimes referred to as core circuitry or core logic. The core logic and the other logic of device 10 may be powered using one or more power supply levels. For example, the core logic may be powered using at least one positive power supply Vcc and a ground power supply Vss. A typical Vcc value is 1.1 volts (as an example). The value of Vss is typically 0 volts.

The transistors on device 10 have four terminals—a source, a drain, a gate, and a body. Body terminals are sometimes referred to as well terminals or bulk terminals. In n-channel metal-oxide-semiconductor transistors, the body terminal voltage can be lowered somewhat relative to ground to reduce power consumption. For example, the body terminal of an n-channel metal-oxide-semiconductor transistor might be reduced to about −0.5 volts (as an example). In p-channel metal-oxide-semiconductor transistors, the body terminal voltage can be elevated slightly with respect to the positive power supply voltage (Vcc) to reduce power consumption. For example, if Vcc is 1.1 volts, the body terminal of a p-channel metal-oxide-semiconductor transistor can be biased at a positive voltage having a magnitude of about 1.6 volts (as an example).

In situations in which the body terminal is biased to reduce leakage current and power consumption, a transistor is sometimes referred to as being reverse body biased. In situations in which the body terminal of a transistor is biased to improve performance by reducing the transistor's threshold voltage, the transistor is sometimes referred to as being forward body biased. To optimize device performance while minimizing power consumption, the transistors in different regions of a programmable logic device integrated circuit or other integrated circuit can be biased differently. For example, some transistors can be forward body biased to enhance performance at the expense of power consumption whereas other transistors can be reverse body biased to reduce power consumption at the expense of switching speed.

Figure 2:
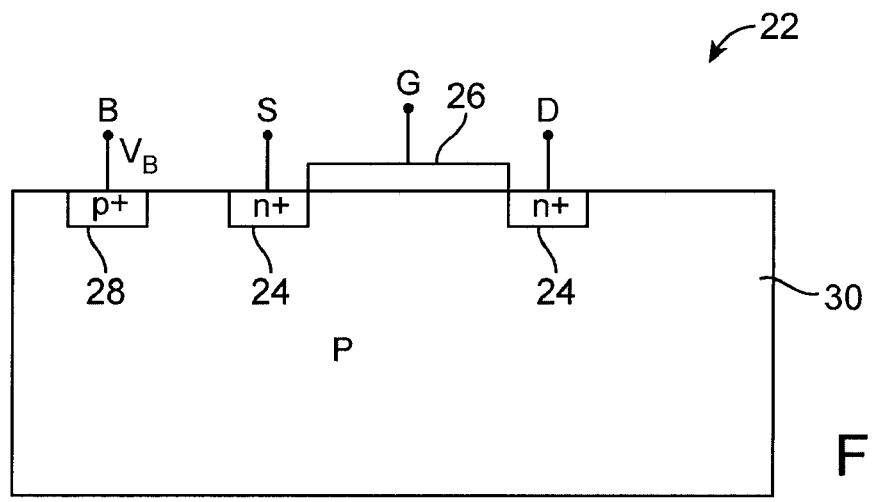
FIG. 2 is cross-sectional view of an illustrative n-channel metal-oxide-semiconductor transistor that may be provided with an adjustable body bias in accordance with an embodiment of the present invention.

A cross-sectional diagram of an illustrative n-channel metal-oxide-semiconductor transistor 22 is shown in FIG. 2. The source of transistor 22 is labeled S, the drain is labeled D, the gate is labeled G, and the body is labeled B. As shown in FIG. 2, a body bias voltage Vb may be applied to body terminal B. Source S and drain D may be formed from n+ implant regions 24. Gate structure 26 may be formed from a thin layer of insulator such as silicon oxide and a gate conductor such as silicided polysilicon. Body terminal B may use p+ implant region 28 to form an ohmic contact with p-type body region 30.

Figure 3:
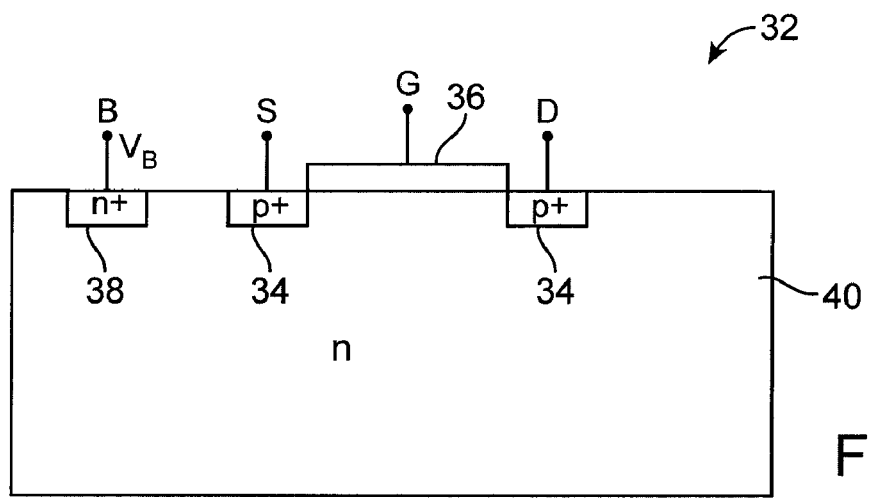
FIG. 3 is a cross-sectional view of a p-channel metal-oxide-semiconductor transistor in accordance with an embodiment of the present invention.

A cross-sectional diagram of an illustrative p-channel metal-oxide-semiconductor transistor 32 is shown in FIG. 2. As with transistor 22 of FIG. 2, the source of transistor 32 in FIG. 3 is labeled S, the drain is labeled D, the gate is labeled G, and the body is labeled B. Body bias voltage Vb may be applied to body terminal B. Source S and drain D may be formed from p+ implant regions 34. Gate structure 36 may be formed from a thin layer of insulator such as silicon oxide and a gate conductor such as silicided polysilicon. An ohmic contact with n-type body region 40 may be formed for body terminal B using an n+ implant in region 38.

Figure 4:
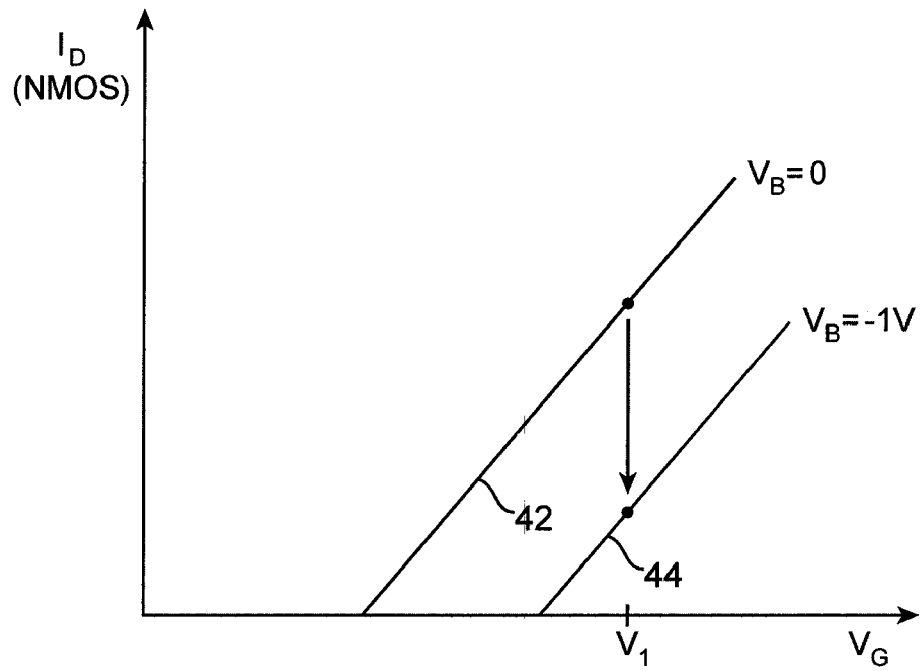
FIG. 4 is a graph showing how the drain current of an n-channel metal-oxide-semiconductor transistor varies as a function of body bias and gate voltage in accordance with an embodiment of the present invention.

The impact of reverse body biasing an NMOS transistor is illustrated in the graph of FIG. 4. In FIG. 4, transistor current Id is plotted as a function of gate voltage Vg. If the body bias for the transistor is equal to 0 volts, the transistor current may be characterized by a curve such as curve 42. If the body bias for the transistor is −1 volt, however, the transistor may be characterized by a curve such as curve 44. As shown by the FIG. 4 graph, the current Id for the transistor at a given gate voltage V1 is reduced when the transistor has this type of reverse body bias. The current Id is reduced because the threshold voltage Vt of the transistor is increased. This results in a reduced off current and reduced power consumption.

Figure 5:
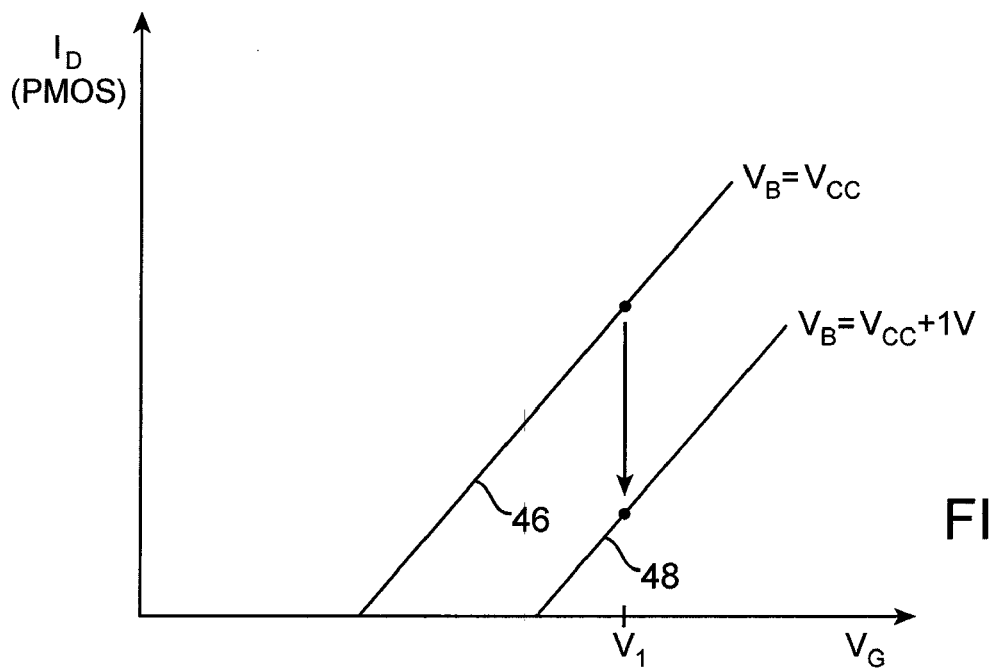
FIG. 5 is a graph showing how the drain current of a p-channel metal-oxide-semiconductor transistor varies as a function of body bias and gate voltage in accordance with an embodiment of the present invention.

PMOS transistors behave similarly when a reverse body bias is applied. The impact of reverse body biasing a PMOS transistor is illustrated in the graph of FIG. 5. As with the graph of FIG. 4, the graph of FIG. 5 includes curves in which transistor current Id has been plotted as a function of transistor gate voltage Vg. When the body bias for the PMOS transistor is equal to Vcc (e.g., 1.1 volts), the transistor current may be characterized by a curve such as curve 46. If the body bias for the transistor is Vcc+1 volt (i.e., 2.1 volts in this example), the threshold voltage Vt of the transistor is increased and the transistor may be characterized by a curve such as curve 48. The reduced current Id for the transistor at a given gate voltage V1 when the transistor has this type of reverse body bias results in reduced off current and reduced power consumption.

Figure 6:
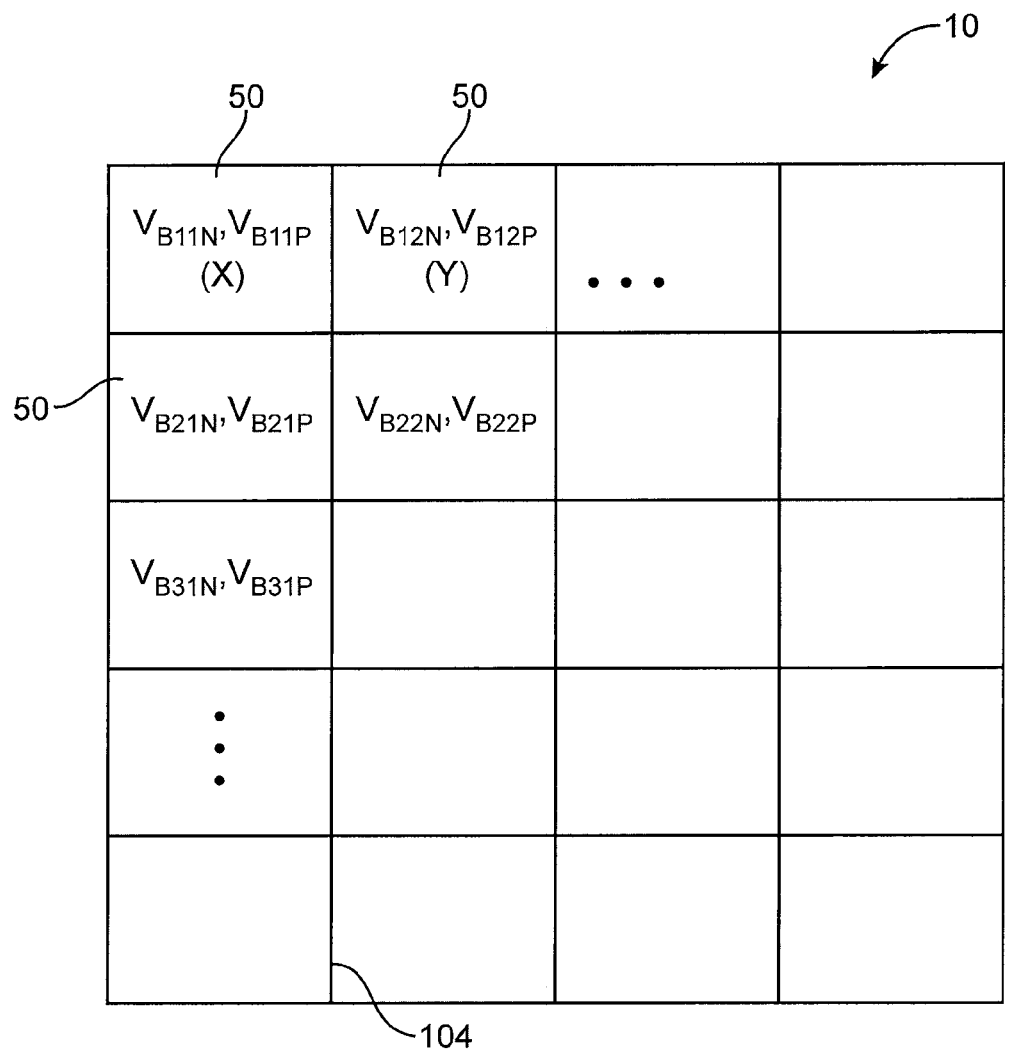
FIG. 6 is a top view of an integrated circuit in which different regions of circuitry have different associated body biases and are isolated by body bias isolation structures in accordance with an embodiment of the present invention.

On modern integrated circuits there may be thousands or millions of NMOS and PMOS transistors. It is therefore generally impractical to select optimum individual body biases for each of the transistors. However, the transistors on the integrated circuit can organized into groups. These groups of transistors can then be biased with a common body bias voltage. An illustrative arrangement in which transistors on an integrated circuit such as device 10 have been organized into regions with individually adjustable body bias voltages is shown in FIG. 6. In the example of FIG. 6, integrated circuit 10 has been divided into regions 50, each of which may have a different NMOS body bias voltage and a different PMOS body bias. For example, the region 50 in the upper left corner of device 10 may have an NMOS body bias voltage of Vb11p and a PMOS body bias voltage Vb11n. Body bias isolation structures 104 may be used to isolate regions 50 from each other.

The values of the different body bias voltages may be individually selected, so some or all of the body biases may be different from each other, some of the body bias voltages may be the same, or all of the body biases may be identical, depending on the particular configuration in which device 10 and its programmable logic 18 is being operated. Each body bias may be generated using a corresponding adjustable voltage regulator circuit, using an externally supplied body bias voltage, or using a combination of on-chip and off-chip voltage sources. Configurable power supply voltage distribution circuits may be used to selectively distribute desired levels of body bias to each region 50. The adjustable body bias circuits and power supply voltage distribution circuitry may be configured by configuration data that is loaded into associated programmable elements 20 during device programming.

Each region 50 may have a single potential corresponding NMOS body bias and a single corresponding PMOS body bias or may have one or more such potential body biases. Hardwired settings or settings established by configuration data loaded into programmable elements 20 such as random-access-memory-based programmable elements 20 may be used to establish the body bias voltages for each region 50.

The regions 50 in FIG. 6 are square in shape. This is, however, merely illustrative. Regions such as regions 50 may have any suitable shape (e.g., rectangular shapes with unequal side lengths, polygonal shapes with more than four sides, etc.).

Each region 50 may have a corresponding p-type body region from which p-type transistor bodies such as p-type body 30 of FIG. 2 are formed and may have a corresponding n-type body region from which n-type transistor bodies such as n-type body 40 of FIG. 3 are formed. It is generally not practical to isolate each transistor's body from the bodies of adjacent transistors. Rather, common body regions are formed. Multiple transistors share these common body regions. For example, numerous NMOS transistors in a given one of regions 50 may share a common p-type body such as p-type body region 30 of FIG. 2. Similarly, numerous PMOS transistors in a given one of regions 50 may share a common n-type body such as n-type body region 40 of FIG. 3. A single common body bias terminal B (or multiple such terminals connected in parallel) may be used when biasing each of these common body regions. For example, there may be a first body terminal B that is associated with the NMOS transistors and in a given region 50 and a second body terminal B that is associated with the PMOS transistors in that region.

Because all of the transistors of a given type (e.g., NMOS or PMOS) in a given region 50 typically share a common body and body bias voltage, it is possible to reduce the leakage currents and power consumption for all of these transistors at the same time. For example, the body that is shared by the NMOS transistors can be reverse body biased and the body that is shared by the PMOS transistors can be reverse body biased. Similarly, it is possible to enhance transistor switching speeds for all of the transistors in a given region 50 by applying forward body biases for those transistors through the common NMOS body associated with the NMOS transistors and through the common PMOS body.

Consider, as an example, a situation in which region X of FIG. 6 contains critical circuitry. This circuitry must operate as fast as possible for optimum performance. The circuitry in region Y is not critical and can operate at slower speeds. Because the circuitry in region Y has more relaxed switching speed requirements than the circuitry in region Y, the body bias voltages of the NMOS and PMOS transistors in region Y may be adjusted to create a reverse body bias. This will reduce the leakage currents for the transistors in region Y. To ensure that the transistors in region X operate with sufficiently high switching speeds, on the other hand, the transistor bodies in region in region X can be provided with a forward body bias or at least a body bias that is less reverse biased than the body bias selected for region Y.

As this example demonstrates, the ability to individually tailor the body bias voltages in separate regions 50 on a device 10 allows overall power consumption to be reduced while satisfying performance constraints.

To ensure that the body bias voltages in one region 50 can be adjusted without affecting the body bias voltages in another region 50, the bodies in regions 50 should be electrically isolated from each other. No low resistance paths should exist between the n-type bodies of different regions 50 and no low resistance paths should exist between the p-type bodies of different regions 50. N-type and p-type bodies should also be isolated from each other.

Integrated circuits such as programmable logic device integrated circuit 10 of FIG. 1 may be provided with body bias isolation structures. These isolation structures electrically isolate transistor body regions from each other, so that the bodies in one region 50 can be biased separately from the bodies in another region 50. The isolation regions can be formed using ion implantation. To reduce the amount of area that is consumed on device 10 by the isolation structures and thereby increase the amount of die area that is available for implementing circuitry on device 10, isolation implants can be performed using nitride implant masks that are aligned with shallow trench isolation (STI) trenches.

Figure 7:
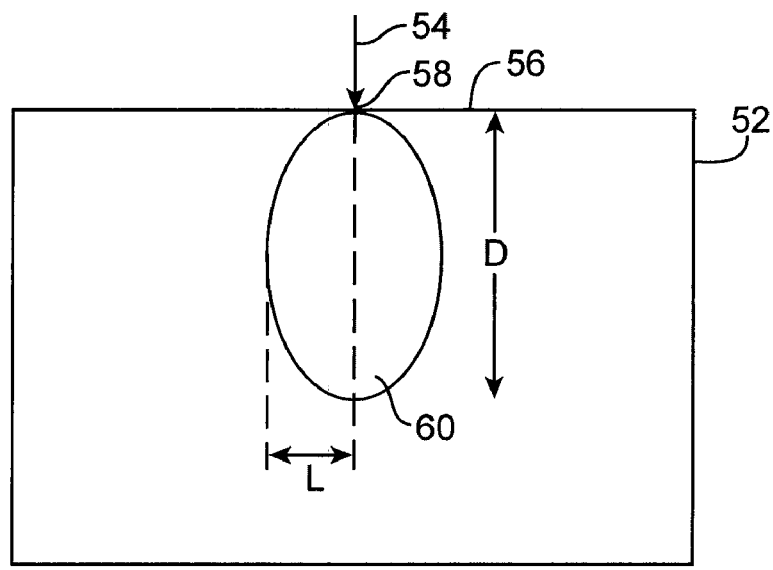
FIG. 7 is a side view of a portion of an illustrative integrated circuit showing how a doped region that is formed by ion implantation may exhibit a lateral spread of implanted dopant.

When implanting dopant into a semiconductor substrate, there is tendency for dopant atoms (e.g., B, P, etc.) to spread laterally. This effect is illustrative in FIG. 7. FIG. 7 is a cross-sectional view of a portion of a semiconductor substrate 52 that is being doped using ion implantation techniques. Dopant ions are being implanted along path 54 and impinge on upper surface 56 of substrate 52 at point 58. Although implanted at a single point 58, the dopant, once implanted, is characterized by a vertical and lateral spread. As shown in FIG. 7, the implanted dopant may form a doped region 60 that is characterized by a maximum implant depth D and a lateral dimension L. The lateral dimension L is typically about 0.7 times the implant depth D.

It is generally desirable to minimize the lateral spread L that is associated with a given implant region. If the magnitude of L is large, the implant region will consume a relatively large surface area on device 10. This will reduce the amount of surface area that would otherwise be available for logic circuitry on device 10. Because the magnitude of the lateral spread L is related to the implant depth D, the amount of area that is consumed by an implant can be reduced by reducing the depth of the implant.

Figure 8:
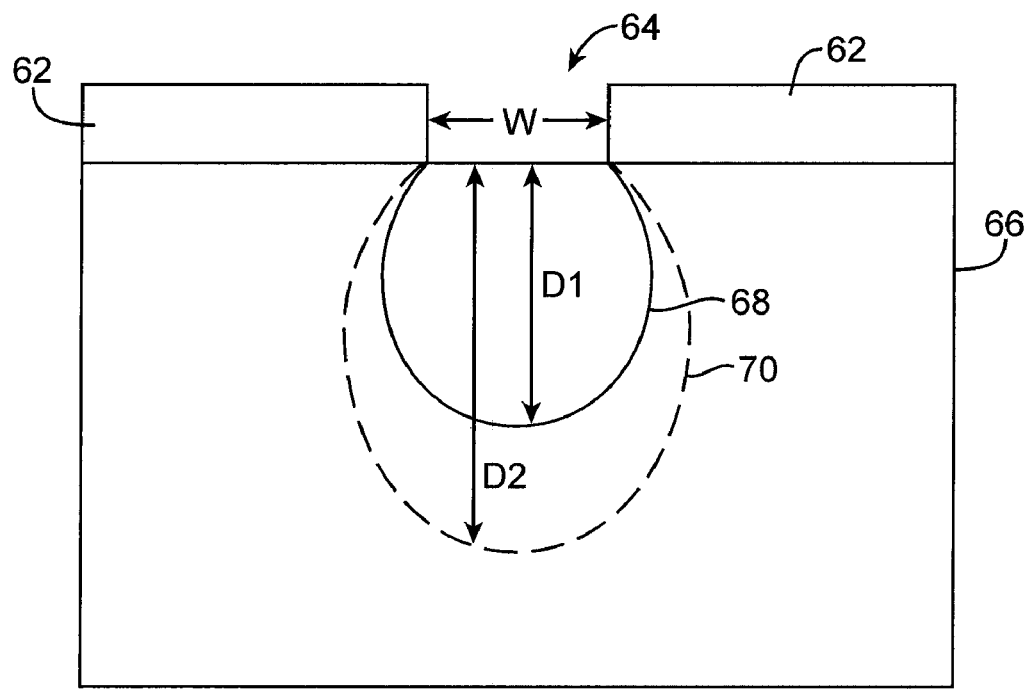
FIG. 8 is a side view of an illustrative integrated circuit showing how dopant that is implanted into a semiconductor substrate through a mask opening may exhibit a lateral spread that is affected by implant depth.

The reduction in lateral spread in dopant that may be achieved by reducing implant depth is shown FIG. 8. As shown in the cross-sectional view of FIG. 8, an implant mask 62 may be formed on the surface of semiconductor substrate 66. Semiconductor substrates such as substrate 52 of FIG. 7 and substrate 66 of FIG. 8 are typically formed from silicon, although other semiconductor or compounds of semiconductors may be used to form substrate 52 if desired (e.g., compounds of silicon and germanium, silicon-on-insulator, etc.). Implant mask 62 may be formed from photoresist, oxides, nitrides, or any other suitable materials. Mask 62 may be patterned by photolithography. For example, mask 62 may be patterned by exposing photoresist through a lithographic mask and developing the exposed photoresist to form a photoresist-based mask, may be patterned by etching a mask material through an overlying prepatterned photoresist mask, may be patterned using lift-off techniques or laser ablation, etc.

As shown in FIG. 8, when dopant is implanted to a depth D1 it forms implant region 68. When dopant is implanted to a depth D2, the dopant forms implant region 70. Because the vertical dimension D2 is larger than the vertical dimension D1, the lateral size of doped region 70 is greater than the lateral size of doped region 68. It may therefore sometimes be possible to reduce the amount of surface area that is consumed by an implant by reducing its implant depth. Reductions in lateral size may also be achieved by reducing the lateral dimension W of opening 64 in implant mask 62.

Figure 9:
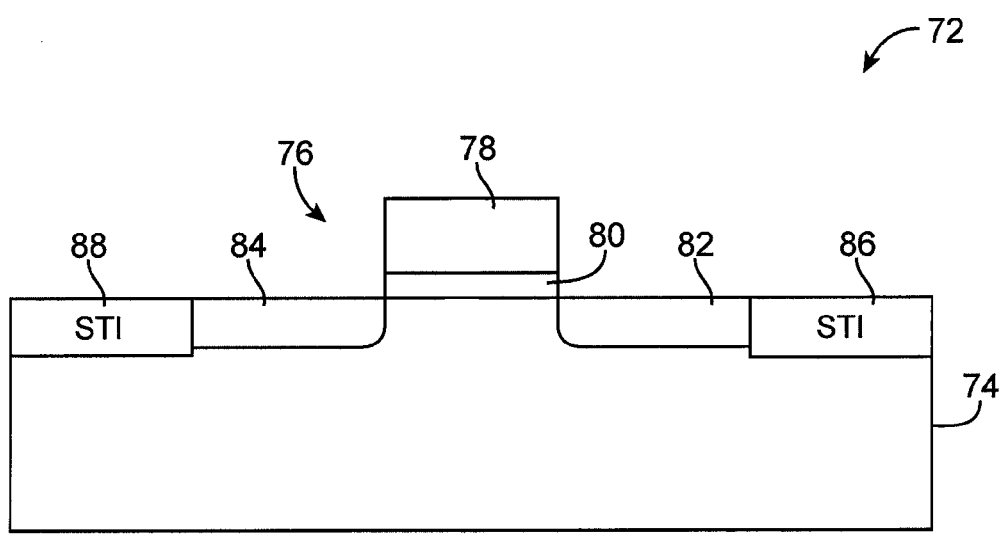
FIG. 9 is a side view of an illustrative metal-oxide-semiconductor transistor having isolation regions formed from shallow trench isolation oxide in accordance with an embodiment of the present invention.

With one suitable arrangement, implants for creating isolation structures may be performed using trenches of the type that are associated with shallow trench isolation (STI) structures. STI structures, which are generally formed from oxide (e.g., silicon oxide) may be used to isolate transistors from each other on an integrated circuit. An illustrative transistor 72 that is isolated using shallow trench isolation is shown in FIG. 9. As shown in the cross-sectional view of FIG. 9, transistor 72 may be formed on a semiconductor substrate 74 (e.g., silicon). Transistor 72 may have a gate 76 that is formed from a gate conductor 78 and a gate insulator 80. Gate conductor 78 may, for example, be formed from silicided polysilicon. Gate insulator 80 may, for example, be formed from an oxide such as silicon oxide or a high-k dielectric material. Source and drain regions for transistor 72 may be formed from highly doped regions 82 and 84. Shallow trench isolation (STI) structures 88 and 86 may be formed adjacent to source and drain regions 82 and 84 to isolate transistor 72 from other structures on the integrated circuit in which transistor 72 is formed. The STI structures are formed by etching shallow trenches in the silicon substrate 74 and by filling the trenches with oxide.

Illustrative operations that may be used in forming body bias isolation structures on device 10 to isolate transistor body terminals in regions such as regions 50 of FIG. 6 are shown in the cross-sectional diagrams of FIGS. 10-18. These operations are merely illustrative. Other suitable operations may be used to form body bias isolation structures if desired.

Figure 10:
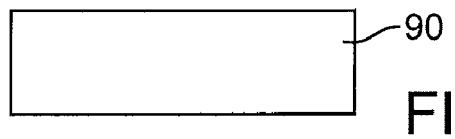
FIGS. 10-18 are cross-sectional side views of a portion of an integrated circuit that contains a body bias isolation region showing how the integrated circuit may be formed during a series of illustrative fabrication steps in accordance with an embodiment of the present invention.

As shown in FIG. 10, device 10 may be formed from a substrate 90. Substrate 90 may contain partially formed transistors or other structures. In a typical configuration, substrate 90 will be formed from a semiconductor such as silicon. Other semiconductors (compound or elemental) or semiconductor-on-insulator structures may be used for substrate 90 if desired.

Figure 11:
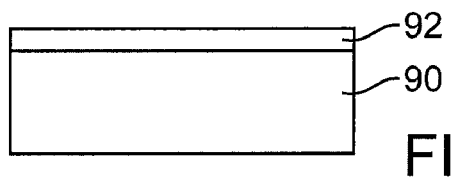

As shown in FIG. 11, a layer 92 of oxide may be formed on substrate 90. Oxide layer 92 may be formed by any suitable technique. For example, oxide layer 92 may be deposited by sputter deposition or chemical vapor deposition. With one particularly suitable arrangement, oxide layer 92 is grown by heating substrate 90 in an oxygen rich environment. Thermal oxide growth may be performed in a furnace or using a rapid thermal oxidation (RTO) tool.

Figure 12:
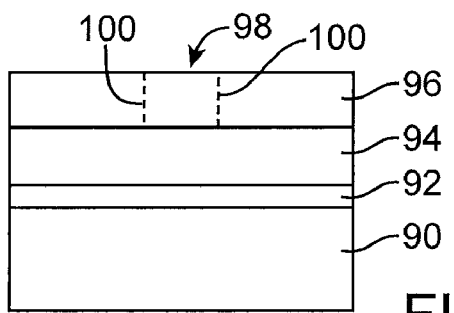

Following oxide layer formation, a masking layer such as a nitride layer 94 (i.e., a silicon nitride layer) may be formed on top of layer 92 (e.g., by chemical vapor deposition or other suitable nitride deposition techniques). Nitride layer 94 may have any suitable thickness (e.g., 1500 Å). A photoresist layer 96 or other suitable masking layer may be deposited on the nitride layer. For example, photoresist layer 96 may be deposited by spinning or spraying photoresist and thermally curing the photoresist in a furnace or RTO tool. The deposited photoresist may then be patterned (e.g., by exposing the photoresist through a lithographic mask and by developing the exposed photoresist or by using other photoresist patterning techniques). In FIG. 12, dotted lines 100 indicate the position of a future opening 98 in photoresist layer 96.

Figure 13:
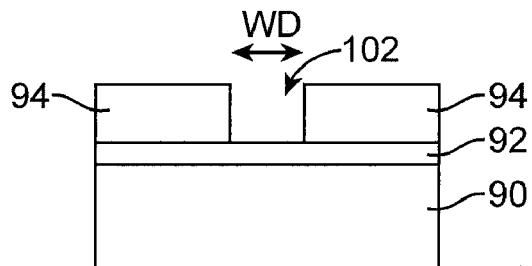

Once opening 98 has been formed in photoresist layer 96, nitride layer 94 may be etched (e.g., using dry or wet etching) to form opening 102, as shown in FIG. 13. The remaining portions of nitride 94 form a mask layer that can be used as both a trench etch mask and an implant mask during subsequent fabrication steps.

In a typical arrangement, isolation structures such as isolation structures 104 of FIG. 6 may be created in the form of long thin regions of dopant that separate adjacent regions 50. The width of each isolation region may be roughly comparable to the width WD of nitride mask opening 102 of FIG. 13. By making WD small (e.g., 0.1 µm), the surface area consumed by the isolation structures on device 10 can be minimized.

The depth of each isolation structure 104 (perpendicular to the upper surface of substrate 90 in FIG. 13) may be established during trench etching and ion implantation operations and may be on the order of thousands of angstroms (as an example). The length of each isolation region 104 (perpendicular to the page as shown in FIG. 13) may be dictated by the size of integrated circuit 10. It is not uncommon for an integrated circuit to have lateral dimensions on the order of millimeters or centimeters. Accordingly, each isolation structure 104 may be millimeters or centimeters in length. In general, isolation structures 104 may be laid out in a grid (e.g., a grid between adjacent regions 50 as shown in FIG. 6), as peripheral isolation paths (e.g., in a square or rectangle surrounding a corresponding square or rectangular region 50), or in any other suitable pattern.

Figure 14:
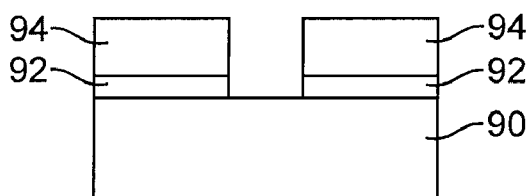

After forming openings such as opening 102 in nitride layer 94, oxide layer 92 may be etched. For example, oxide layer 92 may be etched using a wet etchant such as HF. Following oxidation, both nitride layer 94 and oxide layer 92 will be patterned as shown in FIG. 14. The patterned nitride and oxide of layers 94 and 92 form a patterned mask that may be used as both an etch mask and an implant mask.

Figure 15:
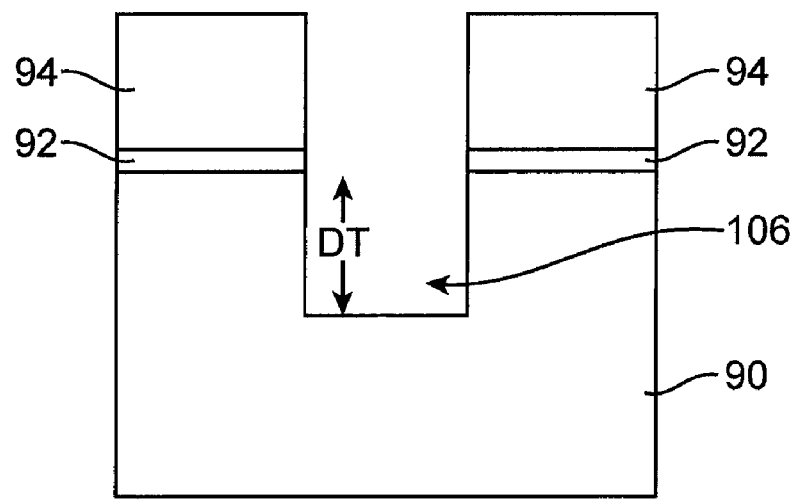
Figure 16:
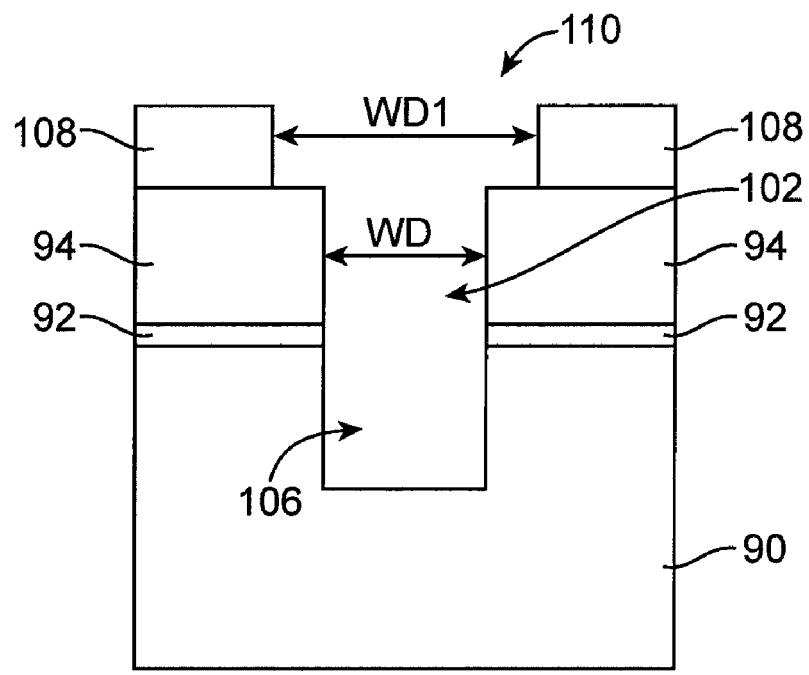

After forming patterned layers 94 and 92, substrate 90 may be etched to form trenches (e.g., using a dry etching tool). As shown in FIG. 15, the mask formed by the patterned nitride and oxide layers 94 and 92 may be used as an etch mask when etching semiconductor (e.g., silicon) substrate 90 to form trenches such as trench 106. Trenches such as trench 106 may be formed to any suitable depth. For example, the depth DT of trenches such as trench 106 may be about 3600 Å. Trenches such as trench 106 may sometimes be referred to as shallow trench isolation trenches, because trenches of this type can be filled with shallow trench isolation (STI) oxide to isolate transistors on device 10 from each other, as described in connection with FIG. 9. Body bias isolation trenches such as trench 106 may be formed at the same time as other STI trenches are being formed to serve as transistor isolation structures.

Following STI trench formation, a layer of photoresist such as photoresist layer 108 may be deposited and patterned (e.g., using photolithography). The photoresist layer 108 may have an opening 110 of width WD1 that is aligned with mask opening 102 and trench 106. To ensure that opening 110 is large enough to accommodate opening 102 and trench 106, width WD1 may be slightly larger than width WD.

Figure 17:
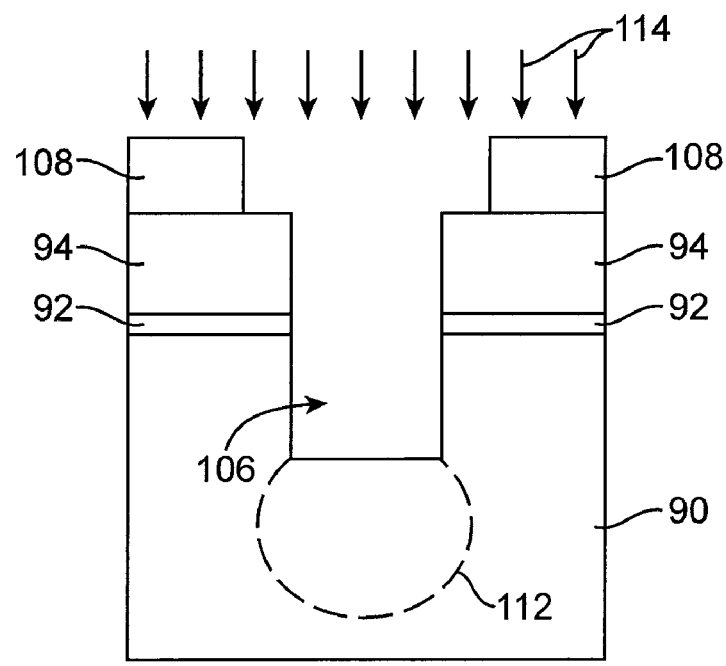

As illustrated by arrows 114 in FIG. 17, dopant may be implanted into a region such as region 112 at the bottom of trench 106 through the opening formed by photoresist layer 108, patterned nitride mask layer 94, and patterned oxide mask layer 92. During ion implantation, mask layers 92 and 94 serve as an implant mask that is aligned with trench 106. Because of the presence of trench 106, it is possible to implant dopant into region 112 using a lower energy than would be possible in the absence of trench 106. The trench effectively lowers the surface of substrate 90 so that the lowest portion of region 112 can be formed using a less energetic implant than would otherwise be required.

Both n-type and p-type dopants may be implanted using the STI trench arrangement of FIG. 17. If n-type dopant is implanted, doped body bias isolation region 112 will form an n-well. If p-type dopant is implanted, doped body bias isolation region 112 of FIG. 17 will form a p-well. Illustrative arrangements in which region 112 is formed from n-type dopant are sometimes described herein as an example. In portions of device 10 that do not need implanted regions such as region 112 for body bias isolation structures, photoresist 108 may prevent dopant from being implanted into the device (e.g., into STI trenches that are to be used for transistor isolation structures of the type shown in FIG. 9 rather than body bias isolation structures).

Figure 18:
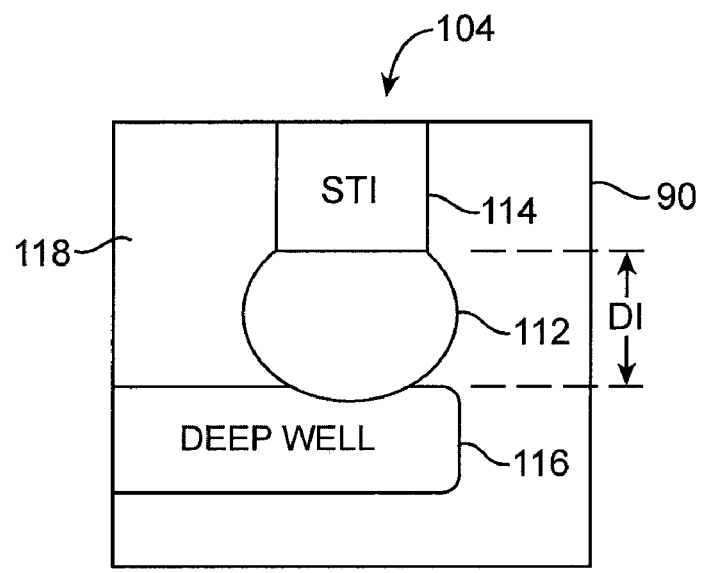

Following formation of implant region 112, photoresist layer 108 may be removed and trenches such as trench 106 may be filled with oxide (STI oxide) 114 (e.g., using thermal oxide growth or oxide deposition techniques), as shown in FIG. 18. Oxide 114 may be planarized using chemical mechanical polishing (CMP) techniques and additional standard STI processing operations may be performed. During CMP operations, nitride layer 94 and oxide layer 92 may serve to protect underlying structures on the wafer. These layers may be removed after CMP operations are complete. In portions of device 10 in which STI structures are used to isolate transistors from each other, the STI oxide in the STI trenches serves as shallow trench isolation. In portions of device 10 in which body regions are being isolated from each other by body bias isolation structure 104, STI oxide 114 and doped region 112 form body bias isolation structures 104. As shown in FIG. 18, body region 118 can be fully isolated from surrounding structures by forming a deep implant 116 that connects with implant region 112. Deep implant 116 (e.g., a deep n-well implant when region 112 is n-type) may be used to prevent low resistance electrical paths from forming between transistor bodies in adjacent regions such as regions 50 (FIG. 6).

The body bias isolation structure 104 of FIG. 18 may consume a relatively small amount of surface area on device 10 due to its relatively small lateral dimensions. With one suitable arrangement, the depth DI of implanted region 112 may be less than a few thousand angstroms (e.g., 1500 Å). As a result, the lateral spread associated with doped region 112 (and therefore isolation structure 104) is about 500 Å (per side). Accounting for both the illustrative 0.1 μm width (WD) and the lateral spread from implanting dopant to a depth of about 1500 Å, the total width of structure 104 should generally be less than about 0.2 μm (as an example).

Figure 19:
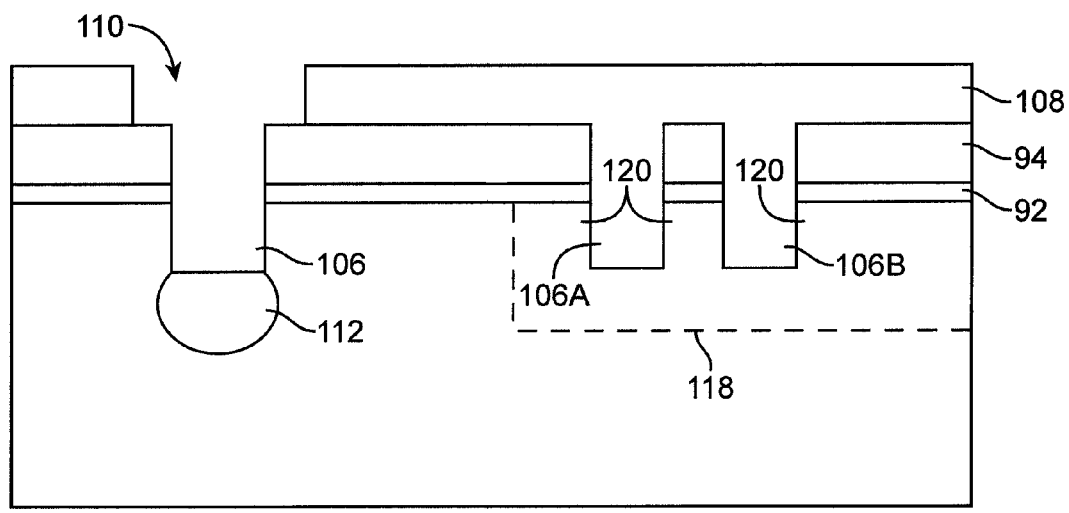
FIG. 19 is a cross-sectional side view of an illustrative integrated circuit showing how certain shallow trench isolation (STI) trenches may be covered with a photoresist mask while other STI trenches are used to define an implant pattern for a body bias isolation region in accordance with an embodiment of the present invention.

FIG. 19 shows how photoresist 108 may be used to shield underlying structures such as STI trenches 106A and 106B when implanting dopant into region 112 below trench 106 in the body bias isolation structure. Dotted line 118 shows the location of a future n-well that may be formed in device 10. N-well 118 may be used to form PMOS devices in regions 120. Following PMOS device fabrication, STI in regions 106A and 106B will serve to isolate the PMOS devices from each other. Photoresist layer 108 prevents implanted ions in regions 120 from interfering with the proper operation of the PMOS devices in regions 120.

Figure 20:
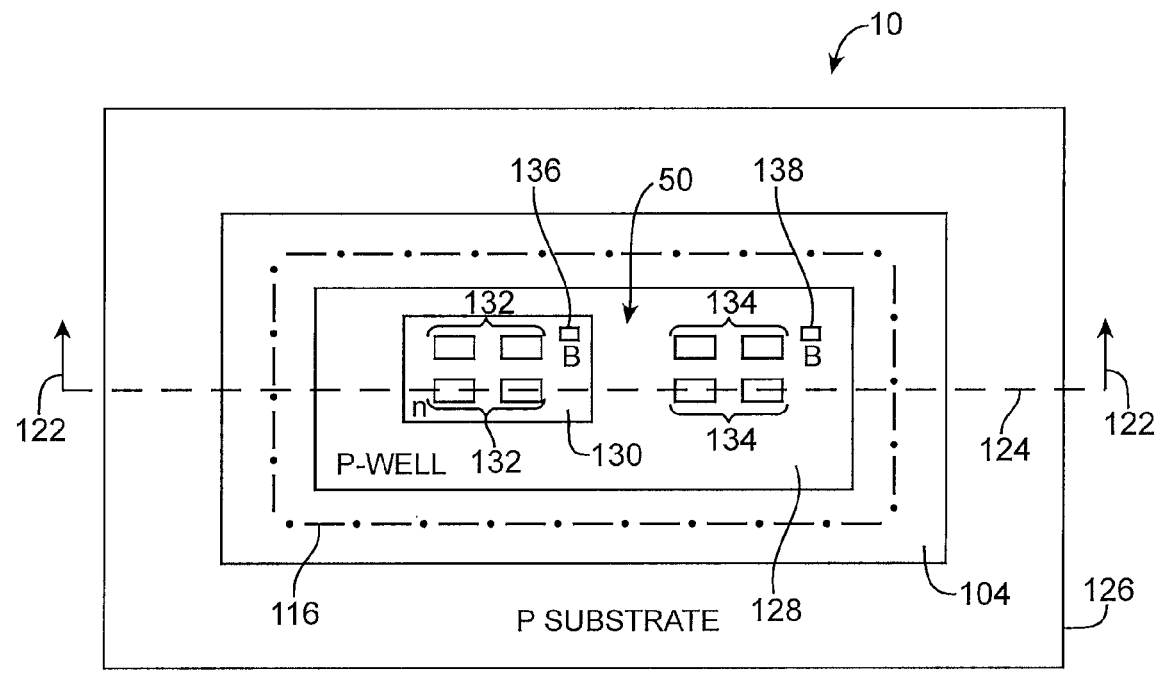
FIG. 20 is top view of a portion of an illustrative integrated circuit in which a p-type body region is isolated from a another p-type region such as a p-type semiconductor substrate region or p-type body using body bias isolation structures in accordance with an embodiment of the present invention.
Figure 21:
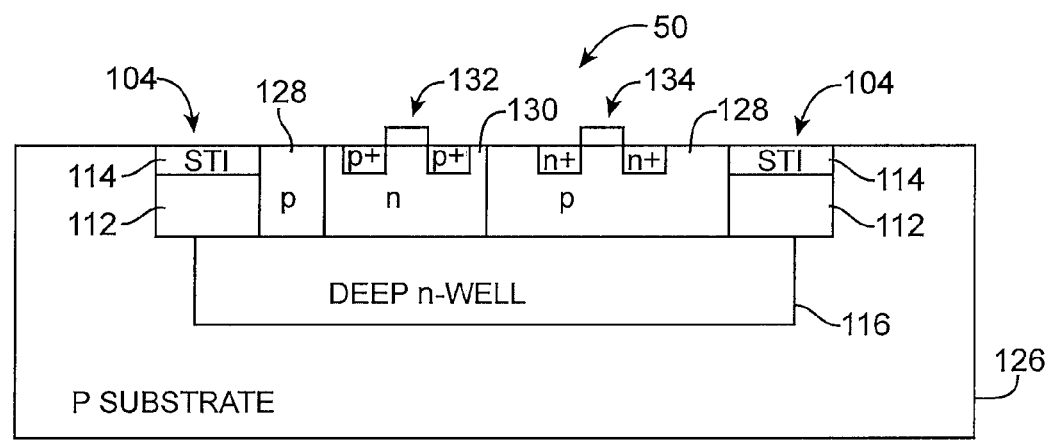
FIG. 21 is a cross-sectional side view of the illustrative integrated circuit portion of FIG. 20 in accordance with an embodiment of the present invention.

A top view of an illustrative region 50 of an integrated circuit such as a programmable logic device integrated circuit 10 that contains body bias isolation structures 104 is shown in FIG. 20. A cross-sectional view of the integrated circuit of FIG. 20 taken along dashed line 124 and viewed in direction 122 is shown in FIG. 21. As shown in FIGS. 20 and 21, device 10 may have a p-type substrate 126. A p-type well 128 may be formed in p-type substrate 126. N-type well 130 may be formed within p-type well 128. PMOS transistors 132 may be formed in n-type body (well) 130 and may have an associated body terminal 136. NMOS transistors 134 may be formed in p-type body (well) 128 and may have an associated body terminal 138. Body terminals 136 and 138 may be biased to any desired voltages.

Body bias isolation structures 104 include STI oxide 114 and doped regions 112 (e.g., n-well regions 112). Deep well 116 (e.g., a deep n-well) may be formed by ion implantation. The deep well 116 connects to doped regions 112 so that n-type isolation surrounds p-well 128 on all sides and below. Deep n-well 116 isolates p-well 128 from substrate 126. N-well (doped region) 112 encircles p-well 128 and provides side isolation in conjunction with STI oxide 114.

Figure 22:
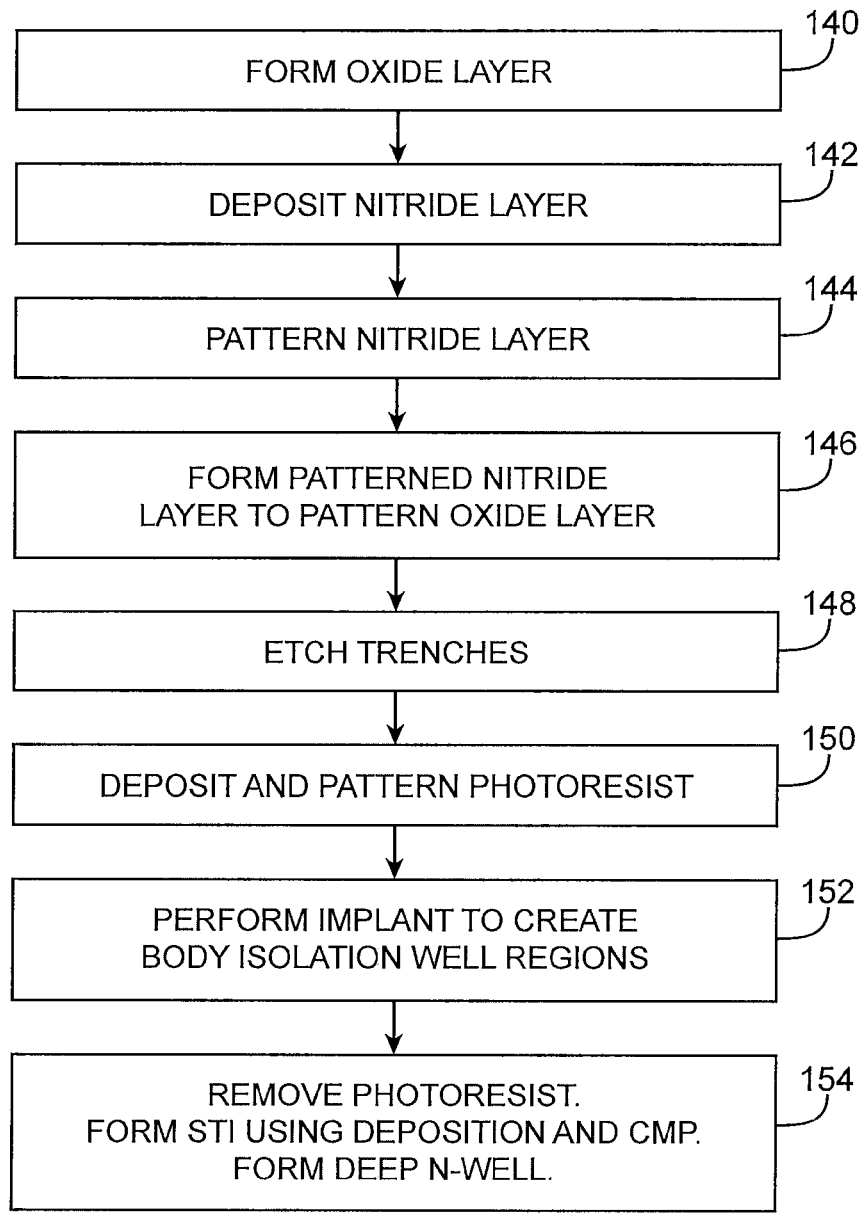
FIG. 22 is a flow chart of illustrative steps involved in forming body bias isolation structures in accordance with an embodiment of the present invention.

Illustrative steps involved in forming body bias isolation structures such as body bias isolation structures 104 of FIGS. 20 and 21 are shown in FIG. 22.

At step 140, an oxide layer such as oxide layer 92 of FIG. 11 may be formed on a silicon substrate for device 10 (e.g., substrate 90 of FIG. 11). The oxide layer may be formed by thermally oxidizing substrate 90 or by depositing oxide on substrate 90.

At step 142, a nitride layer such as layer 94 of FIG. 12 may be formed on the oxide layer. For example, nitride may be deposited on the oxide layer using chemical vapor deposition.

At step 144, the nitride layer may be patterned. For example, a layer of photoresist such as layer 96 of FIG. 12 may be deposited on the nitride layer. The deposited photoresist may be patterned using photolithography. A nitride etch may be performed using the patterned photoresist as an etch mask. The resulting patterned nitride layer 94 may have openings with relatively narrow (e.g., 0.1 μm) widths, as shown by opening 102 in FIG. 13.

At step 146, the patterned nitride layer 94 may be used as an etch mask when etching oxide layer 92. After patterning the oxide layer in this way, the processed device appears as shown in the cross-sectional drawing of FIG. 14.

At step 148, STI trenches such as trench 106 of FIG. 17 are formed. The nitride mask of layer 94 serves as an etch mask during trench formation.

Following trench formation, photoresist layer 108 (FIG. 17) is deposited and patterned (step 150).

At step 152, ion implantation is used to implant dopant in substrate 90. Because the patterned nitride layer 94 that was used to define the etch mask for trenches 106 is still present, the patterned nitride layer also serves as an implant mask. Using a process that is self-aligned in this way makes it possible to form narrow linewidths for trench 106 and doped region 112, without concern for potential misalignment between separate trench etching and implant masks.

At step 154, photoresist layer 108 may be removed and STI oxide or other insulating material may be used fill trench 106, and chemical mechanical polishing operations may be performed to planarize the device. A deep n-well such as deep n-well 116 of FIG. 18 may then be formed by ion implantation.

The foregoing is merely illustrative of the principles of this invention and various modifications can be made by those skilled in the art without departing from the scope and spirit of the invention.

What is claimed is:

1. An integrated circuit having a silicon substrate, comprising:
   a plurality of p-type transistor bodies each of which is located in a separate region of the integrated circuit and each of which forms a transistor body terminal for a plurality of associated n-channel metal-oxide-semiconductor transistors, wherein each of the p-type transistor bodies surrounds a respective n-type transistor body that is shared by a plurality of p-channel metal-oxide-semiconductor transistors; and
   a body bias isolation structure that isolates the p-type transistor bodies from each other, wherein the body bias isolation structure comprises a trench in the silicon substrate, a region of dopant implanted at the bottom of the trench, and an insulator that fills the trench above the region of dopant, wherein each p-type transistor body forms a single p-well that is surrounded by the body bias isolation structure and that is uninterrupted by any trenches.

2. The integrated circuit defined in claim 1 wherein the insulator comprises shallow trench isolation oxide.

3. The integrated circuit defined in claim 1 wherein the trench comprises a shallow trench isolation trench, the integrated circuit further comprising a doped well formed below at least one of the p-type transistor bodies.

4. The integrated circuit defined in claim 1 wherein the trench comprises a shallow trench isolation trench, the integrated circuit further comprising a doped well formed below at least one of the p-type transistor bodies, wherein the doped well contacts the region of dopant.

5. The integrated circuit defined in claim 1 wherein the trench comprises a shallow trench isolation trench and wherein the insulator comprises shallow trench isolation oxide, the integrated circuit further comprising a doped well formed below at least one of the p-type transistor bodies, wherein the doped well contacts the region of dopant.

6. The integrated circuit defined in claim 1 further comprising programmable elements loaded with configuration data, wherein the integrated circuit comprises a programmable logic device integrated circuit.

7. The integrated circuit defined in claim 1 wherein the region of dopant comprises n-type dopant.

8. An integrated circuit comprising:
   a silicon substrate;
   a plurality of n-channel metal-oxide-semiconductor transistors formed on the silicon substrate, each of which has a gate terminal, a source terminal, and a drain terminal;
   a plurality of p-type transistor bodies each of which is located in a separate region of the integrated circuit and each of which forms a transistor body terminal for a separate group of the n-channel metal-oxide-semiconductor transistors, wherein each of the p-type transistor bodies surrounds a respective n-type transistor body that is shared by a plurality of p-channel metal-oxide-semiconductor transistors and wherein each of the p-type transistor bodies forms a single p-well that is uninterrupted by any trenches; and
   body bias isolation structures that isolate the p-type transistor bodies from each other, wherein the body bias isolation structures comprise:
   trenches formed in the silicon substrate;
   a region of n-type dopant implanted at the bottom of the trenches; and
   oxide that is formed above the region of implanted dopant and that fills the trenches.

9. The integrated circuit defined in claim 8 further comprising n-wells formed beneath the p-type transistor bodies, wherein the n-wells contact the region of n-type dopant in the body bias isolation structures.

10. The integrated circuit defined in claim 8 further comprising programmable logic, wherein the integrated circuit comprises a programmable logic device integrated circuit and wherein the n-channel metal-oxide-semiconductor transistors are included in the programmable logic.

11. The integrated circuit defined in claim 8 wherein at least some of the p-type transistor bodies are biased at different voltages.

12. The integrated circuit defined in claim 8 wherein at least some of the p-type transistor bodies are reverse body biased and at least some of the p-type transistor bodies are forward body biased.

* * * * *